United States Patent [19]

Ewanizky, Jr.

[11] 4,375,594
[45] Mar. 1, 1983

[54] THYRATRON MARX HIGH VOLTAGE GENERATOR

[75] Inventor: Theodore F. Ewanizky, Jr., Manasquan, N.J.

[73] Assignee: The United States of America as represented by the Secretary of the Army, Washington, D.C.

[21] Appl. No.: 224,604

[22] Filed: Jan. 12, 1981

[51] Int. Cl.³ .............................................. H02M 3/18
[52] U.S. Cl. .................................................. 307/110
[58] Field of Search .......................... 307/71, 297, 110

[56] References Cited

U.S. PATENT DOCUMENTS 3,229,124  1/1966  Schofield ............................ 307/110

OTHER PUBLICATIONS

IEEE Transactions on Nuclear Science, Aug. 1970, vol. NS-18, #4, pp. 190–198, by Fitch.
Pulse Power Symposium, Orlando, FLorida, Jun. 1980, "High Repetition Rate Thyrathron Marx Bank", Paper by T. F. Ewanizky.
Formation of Nanosecond Pulses of High Voltage, 1971, Mesvats et al., p. 161, Airforce Systems Command Foreign Technology Division.

Primary Examiner—Donald A. Griffin
Attorney, Agent, or Firm—Nathan Edelberg; Sheldon Kanars; Jeremiah G. Murray

[57] ABSTRACT

Thyratrons are used as the switching devices for connecting capacitive storage devices in series after they have been charged in parallel. In the preferred embodiment, the capacitive device is placed before the thyratron in each stage, so that the output pulse is of the same polarity. The inductors connected to the cathodes have secondary windings to form transformers, for triggering the thyratrons of the following stages.

5 Claims, 4 Drawing Figures

THYRATRON MARX HIGH VOLTAGE GENERATOR

The invention described herein may be manufactured and used by or for the Government for governmental purposes without the payment of any royalties thereon or therefor.

BACKGROUND OF THE INVENTION

This invention relates to a high voltage pulse generator of the Marx type, in which capacitors are charged in parallel and discharged in series.

Amongst the many techniques for producing high voltage pulses, the Marx generator is probably the best known and most widely used. For the combination of short risetime and low output impedance (i.e. high power), large energy, high efficiency and waveform flexibility—the Marx principle is peerless.

The essence of the Marx principle is to charge a number of capacitive storage elements (electrostatic energy stores) in parallel and then, through transient switching techniques, connect (or "erect") the elements in series, thus producing an effective multiplication of source voltage. And the key to the Marx operation lies in the triggering of the series-connecting switches. In the original generator described by Erwin Marx in 1923, the capacitors were charged in parallel through high resistances and the switches were simple, 2-electrode spark gaps triggered by the over-voltage accumulating from the switching of previous stages.

The state of the art is summarized by R. A. Fitch in the IEEE Transactions on Nuclear Science, Vol. NS-18, #4, pages 190-198 (August 1970). The greatest development in terms of waveform duration and flexibility has occurred within the last one or two decades. To this time, virtually all circuits have been limited to single-shot operation because of the limitations of spark gaps.

Next generation application of Marx Banks to power high energy lasers and electron beams will require circuits capable of repetitive operation ranging up to kilohertz (kHz) frequencies. This requirement poses severe difficulties for the spark gap as a Marx switching component. To obtain a low pre-fire probability on this device will require extraordinary research and development efforts, and likely produce circuits and configurations that are much less compact than their single-shot counterparts.

In response to the recognized need for a Marx generator capable of a high repetition rate, I have investigated Marx circuitry using modern thyratrons as the switching elements. Because of the relatively high voltage trigger requirements of spark gaps, Marx circuitry developed for these devices has concentrated on achieving a balance between hold-off reliability and triggering schemes that produce an orderly erection mode, so that predictable output pulses may be realized. High repetition rate capability, low voltage trigger requirements, and high reliability are well known thyratron characteristics when used in a conventional manner. However, particular problems arise with the use of thyratrons in a Marx circuit, such as both external and internal arcing, because of progressively increasing overvoltages.

SUMMARY OF THE INVENTION

The object of the invention is to provide a satisfactory high voltage Marx generator with a high repetition rate.

According to the invention, a thyratron is used as the switching element in each stage; and in each iterative stage one of the charging and isolating impedance devices is an inductor forming the primary winding of a transformer, with the secondary winding coupled to the grid of the thyratron in a later stage to fire it. In at least the first stage, the grid is coupled to an external trigger source to initiate erection.

BRIEF DESCRIPTION OF THE DRAWINGS

These and other features of the present invention will be more readily understood from a consideration of the following detailed description taken in connection with the accompanying drawings in which.

DETAILED DESCRIPTION

A paper entitled "High Repetition Rate Thyratron Marx Bank" presented at the Pulse Power Symposium (June 3-5, 1980) and published later in the year, is incorporated herein by reference.

Figure 1:
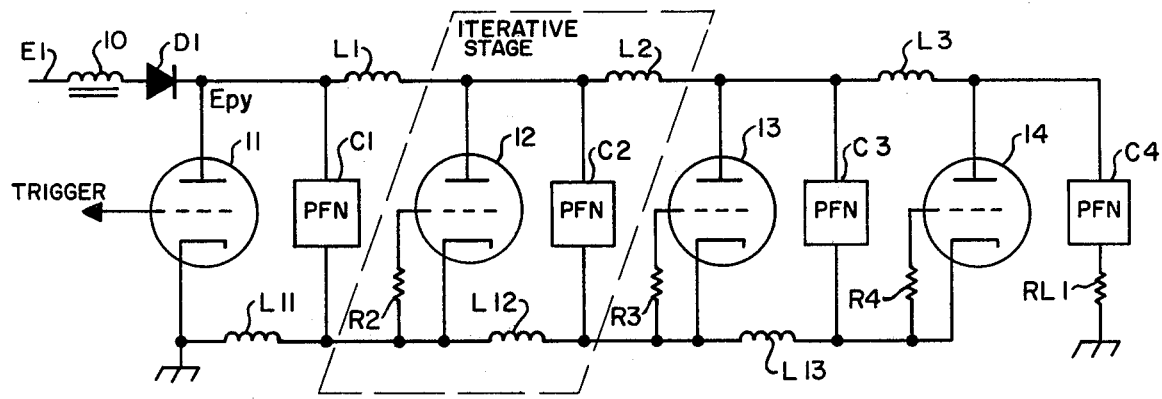
FIG. 1 is a circuit diagram for a thyratron Marx generator constructed in accordance with the invention.

A practical circuit using thyratrons in a Marx generator is shown in FIG. 1. It is shown as comprising four stages, but in general there may be any number of stages. The second stage, blocked as a typical iterative stage, comprises an electrostactic storage device C2, a thyratron switch 12 with a resistor R2 connected from the grid to the cathode, and two chokes L2 and L12. The storage device C2 may be a capacitor or a more complex pulse forming network (PFN) well known in the art. Choke L2 is connected between the anodes the thyratrons 12 of this stage and 13 of the next stage. All stages are identical except for the first and last. In the first stage, the thyratron 11 has its anode coupled to a power source E1 through a high-inductance choke 10 and a diode D1, its grid connected to a trigger generator, and its cathode connected to ground, the resistor between the grid and cathode being omitted. In the last stage there are no chokes, and the storage device C4 is connected from the anode of thyratron 14 to a load RL1.

An experimental circuit as shown in FIG. 1 which was constructed and tested uses conventional 8613 thyratrons and pulse forming networks (PFNs) as the storage elements. The circuit was found to produce efficient voltage multiplication, delivering 32 kilovolts, one microsecond pulses at repetition rates up to 500 hertz, with an 8 kilovolt direct current supply. It was found that both external and internal arcing, partly due to conventional tube construction, was the most important factor in limiting the maximum input voltage. However, the circuit operated reliably over a relatively wide range, down to thyratron minimum voltage.

The particular considerations which affect circuit design for spark gaps are not necessarily appropriate for thyratrons. First, thyratron trigger requirements are typically satisfied by low voltage pulses of only a few hundred volts. Consequently, the more sophisticated schemes deriving trigger voltages by back-coupling are not necessary. This thyratron characteristic, alone, allows simpler circuitry and wide voltage range operation and would be expected to enhance reliability. A second major difference from spark gaps is the relatively long switching time of thyratrons in response to an applied trigger. Once triggered, a spark-gap Marx circuit will erect at a speed determined by interstage capacitance (determined to a large degree by component configuration and arrangement). Switching time of a spark-gap may be only the order of a nanosecond. In contrast, switching time, or anode delay time, of thyratrons depends primarily on internal gas pressure (approximately fixed) and conduction length of the tube. Even with anode potential and fast-rise grid trigger pulses, ionization of the total conduction length and production of a low impedance plasma involves processes that typically have 100–200 ns duration. Thus, the erection of a thyratron Marx circuit can be expected to proceed relatively slowly and be limited by the switching time per stage.

In the circuit shown in FIG. 1, only the lowest stage is triggered by a conventional trigger generator. The erection mode can be explained in a manner similar to the triggering of series-connected thyratrons in conventional circuits. When the first stage is triggered for example, the first PFN C1 attempts to discharge through the choke L11, dropping the second tube cathode to negative anode potential, effectively doubling the anode to cathode voltage. However, due to the capacitive voltage divider formed, in each tube, by the anode-grid and grid-cathode internal capacitance, the grid becomes positive with respect to cathode and triggers the tube. The grid resistor for each tube provides a path for deionization and recovery between pulses. (It was found that its value is not critical beyond approximately 25 kilohms, but it forms a secondary purpose of limiting grid current and thus should not be very small in value).

The inductors, L1–L3 and L11–L13, were chosen as interstage decoupling elements, instead of resistors, in the interests of circuit efficiency and ease of fabrication. In their design, it is necessary that their value be such that the oscillation period of each inductor and the capacitance of its associated PFN is much longer than the total erection and pulse discharge time. This automatically ensures small circulation currents and power loss during the total erection time.

The anode voltage, Epy, is approximately twice the dc supply voltage, E1 and is derived from the resonant charging circuit. This supply voltage increase offsets the voltage decrease obtained in using PFN's as storage elements (peak discharge voltage for an impedance-matched PFN is the network voltage, $E_n = E_{py}/2$). PFN's were used instead of capacitors to alleviate analysis of waveforms and potential problems with load mismatch. In this regard, note that the series-connected PFN's are simply matched by providing a load resistance, RL1, equal in value to the sum of PFN impedances in the circuit. In actual practice, a slight negative mismatch is used to aid tube recovery-standard practice for line-type thyratron pulsers. An interesting alternative to the erection of PFN elements is to erect capacitors as part of a single PFN configuration.

Returning to FIG. 1, the iterative structure of the circuit may be easily discerned. Each stage consists of a thyratron, a PFN, and two chokes. The chokes serve as both a reactive load during the circuit erection (as described before) and isolation after erection when the pulse is being delivered to the load.

Experimental Results

In the actual experimental circuit, the PFN's each consist of five 0.0025 microfarads pulse capacitors with external inductors to form an E* configuration, giving 1 microsecond pulses, with 50 ohm characteristic impedance. The isolating chokes were wound on linear ferrite cores, giving 1.6 millihenry (mH) inductance. Low capacitance filament chokes were necessary to isolate the thyratron cathodes during operation (conventional) transformer primary to secondary capacitance would shunt the signal to ground). An appropriate resistive load was constructed with low-inductance, tubular, carborundum resistors.

The circuit as constructed delivers negative pulses to the load. The four-stage circuit produced efficient voltage multiplication, evidenced by the 1 microsecond PFN output pulse, corresponding to 32 kV peak load voltage. Wide voltage flexibility was easily obtained, with reliable erection occuring for supply voltages greater than only a few hundred volts.

Although the circuit operated satisfactorily at low voltages, problems with external and internal arcing were frequently experienced with E1 approximately 8 kV and limited maximum anode voltage to Epy approximately 16 kV. Arcing occurred between grid and cathode socket pins and connections, and also between electrode leads internal to the tubes. Problems were also experienced with arcing between secondary and primariy windings of the filament transformers of the elevated stages. These external and internal breakdowns generally caused one or more of the tubes to go into constant conduction, halting operation. A radiological survey conducted during circuit operation determined that X-ray emission was detectable especially from the last tube, for voltages of Epy approximately 12 kV. At certain times, however, X-ray emission was detected, even from the first tube, for lower anode voltage. This spurious operation causing abnormal X-ray emission was symptomized by audible microphonics, noisy output pulses and strong electro-magnetic interference. Effective X-ray protection was obtained by simply placing a tubular lead shield around each tube, particularly shielding the grid-anode space.

The cause for spurious arcing at higher voltages can be traced to the progressively increasing anode-to-cathode and grid-to-cathode potentials that are momentarily experienced by each tube as the erection phase proceeds. When the (n−1)th tube fires and conducts, the nth tube will have an anode voltage of +Epy and a transient negative cathode voltage of (n−1)Epy, corresponding to a net anode-cathode potential of nEpy. It is easily seen that this net transient voltage can substantially exceed the 20 kV dc holdoff rating of the 8613 thyratron in only a few stages, with only moderate values of supply voltage. This transient over-voltage persists across each successive stage until it attains a low impedance state.

Measurements showed that the total anode delay from stage to stage was almost constant at 80–100 ns, over a wide range of Epy. The erection speed is obviously limited by the ionization time of each thyratron. It is believed that the X-ray emission observed is generated during this period before the thyratrons achieved a low-impedance state. Due to the high current demands of the transient overvoltages, high-impedance discharge may occur between the thyratron elements, causing both X-ray emission and the symptomatic, audible microphonics. Sustained operation would certainly cause cathode destruction, deposition of (cathode) low work-function material on the grid, and subsequent grid emission.

Figure 3:
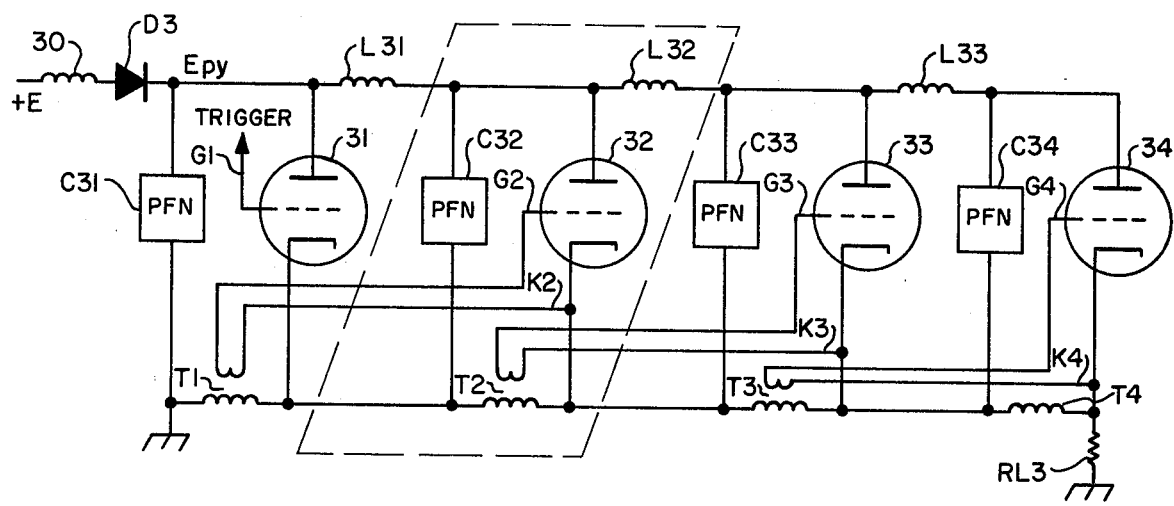
FIG. 3 is a circuit diagram showing the preferred embodiment of a modified form of thyratron Marx generator.

FIG. 3 shows as the preferred embodiment a modified form of circuit for a Marx generator which eliminates may of the problems (i.e. progressively increasing overvoltages) and is more appropriate for thyratron use. It is also shown as comprising four stages, but in general there may be any number of stages. As in FIG. 1, the second stage, blocked as a typical iterative stage, comprises an electrostatic storage device C32, a thyratron switch 32, and two chokes L32 and T2 (primary winding). Comparison of FIG. 3 with FIG. 1 shows that the major modification is the positional interchange of the thyratron and the storage device. Again the storage device may be a capacitor or a more complex pulse forming network (PFN). Choke L32 is connected between the anodes of the thyratrons 32 of this stage and 33 of the next stage, while the choke T2 (primary) is connected between the cathodes of thyratron 33 of this stage and 31 of the preceeding stage. The storage device C32 is anode of thyratron 32 and the cathode of thyratron 31 of the preceeding stage. All of the stages are identical except for the first and last. In the first stage, the thyratron 31 has its anode coupled to a direct-current power source +E through an inductance choke 30 and a diode D3, and its grid connected to a trigger generator. The choke T1 (primary) is connected between the cathode of tube 31 and ground. The choke L31 and the storage device C31 are connected as in the second stage. The last stage differs from the typical stage in that there is no anode choke, and the cathode of thyratron 34 is connected to a load RL3. The thyratrons may be type 8613. The filaments of each thyratron in both FIGS. 1 and 3 are powered by isolation-type transformers (not shown).

A feature of the circuit of FIG. 3 is the triggering scheme for the thyratrons. Each cathode choke of each stage except the last is provided with a small secondary winding around it to form transformers T1-T3. This secondary winding is connected to the grid and cathode of the following stage thyratron.

In operation, the direct current supply voltage +E charges all of the capacitive storage elements C31-C34 through the inductors 30 and L31-L33. At rest, all of the capacitive storage elements appear to be in a parallel-connected configuration, and are charged to a potential of +E. Upon initiation of an appropriate external trigger voltage on lead G1 to the grid of the first thyratron 31, it fires (conducts) and the first capacitive storage device C31 begins to discharge through the primary of the first transformer T1. (This discharge period is made long with respect to the total sequence of events by an appropriate value of inductance of the transformer primary.) The secondary winding is connected via leads (G2 and K2 to the grid and cathode elements of the second thyratron 32, and produces a trigger voltage at the second tube by the current induced by the primary discharge. This trigger voltage causes the second thyratron 32 to fire, and the process is repeated up to the last stage. When all of the thyratrons are conducting, the capacitive storage elements are transiently series connected to the load RL3 (see FIG. 4) and present a discharge pulse of multiplied voltage four times (in general N times) the supply voltage +E. During the pulse discharge period, the inductors L31-L33 present a high impedance—they could be replaced by appropriate large values of resistance. After the capacitors have discharged through the load in a pulse, the thyratrons recover, become non-conducting, and the charging cycle begins, readying the circuit for the next pulse discharge.

Figure 2:
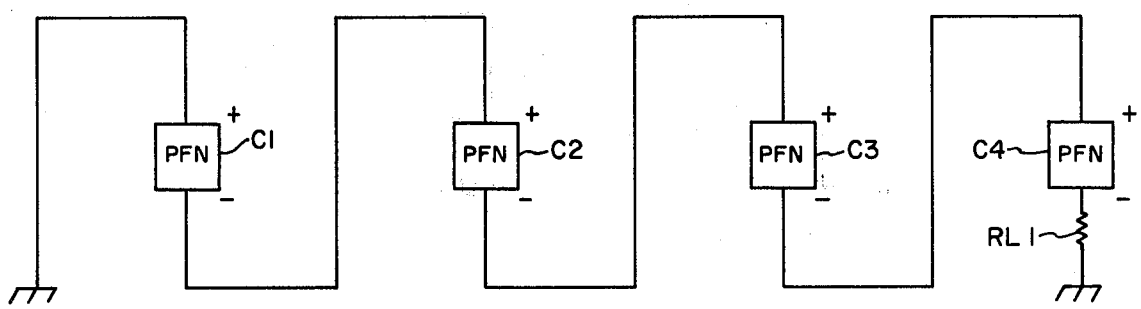
FIG. 2 is a simplified diagram of the circuit of FIG. 1 in the erected phase.
Figure 4:
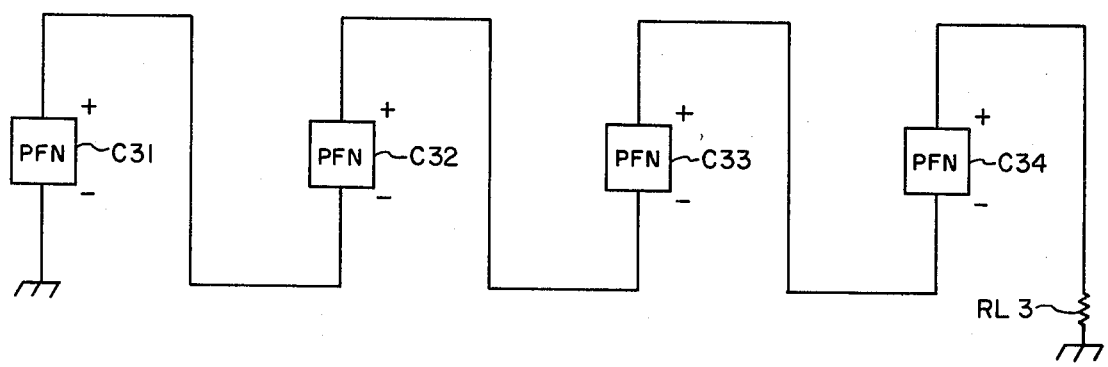
FIG. 4 is a simplified diagram of the circuit of FIG. 3 in the erected phase.

As seen from the simplified diagrams in FIGS. 2 and 4 for the erected phases of FIGS. 1 and 3 respectively, the configuration of FIG. 1 produces a negative pulse, whereas that of FIG. 3 produces a positive pulse output.

The particular configuration of components comprising the circuit of FIG. 3 allows Marx principle operation but does not incur the progressive overvoltage destruction to thyratron utilization as the switching elements. Examination of the circuit diagram shows that during the commutation period of each thyratron, the anode-cathode potential has a maximum value of E, the supply voltage, and elevated stages do not experience a progressively increasing overvoltage. (In FIG. 1, a typical circuit appropriate for spark-gap switches, the Nth stage experiences an anode-cathode potential of N times the supply voltage. In FIG. 3, after the previous tube has fired, the Nth tube sees positive voltages on both its cathode and anode. The cathode voltage becomes $(N-1)$ Epy and the anode voltage NEpy, for a net anode-to-cathode potential of only Epy for any tube in the string. This would be a poor circuit for spark-gap switches, where overvoltage is necessary, but should be most appropriate for thyratrons where overvoltages produce serious problems and limitations.

The circuit of FIG. 3 also features a grid-triggering scheme to trigger progressive stages of the Marx circuit. The transformer coupling between stages is simple, efficient, and easily and inexpensively fabricated. It also has flexibility in that it allows easy modification of the erection mode leading to series connection. If rapid erection of the circuit is desired, the first N-number of stages may be externally triggered simultaneously and the secondary connections of each of these stages led to $N+1$ stages ahead of it. Thus the circuit erects to series connection in blocks of N number of stages, rather than one-by-one.

CONCLUSION

The features of this circuit allow construction and operation of a high repetition rate, thyratron switched pulse generator of a modified Marx type. Because of the constant (not progressively overvoltaged) anode-cathode potential on each stage, high peak voltage pulses can be generated with an arbitrary number of stages while each individual stage safely operates within rated capability. In addition, the transformer-coupled grid-triggering scheme allows wide flexibility in determining erection speed of the circuit to series connection of the capacitive storage elements.

What is claimed is:
1. A Marx generator comprising a plurality of stages between a direct-current source and a load, each stage comprising an electrostatic storage device and a thyratron having cathode, grid and anode electrodes, a plurality of anode impedance devices each connected be- tween the anode electrodes of two adjacent stages, a plurality of cathode impedance devices, one connected between the cathode electrode of the first stage and a reference point and one connected between the cathode electrodes of each adjacent stage, each of said electrostatic storage devices having two terminals, one connected to the anode electrode of the same stage and the other coupled to a reference point, said coupling to a reference point being direct in the first stage and including said cathode impedance devices for the intermediate stages, said load being connected between the cathode electrode of the last of said stages and said reference point, charging means coupling said direct-current source between the anode electrode of the first stage and said reference point to charge all of said electrostatic storage devices in parallel, the grid electrode of at least the first stage being coupled to an external trigger source, trigger means for the other stages, so that in response to a trigger signal from said external trigger source, the thyratron of the first stage and the other stages are fired into conduction, which effectively connects all of said electrostatic storage devices in series to supply an output pulse to said load of the same polarity as said direct-current source.

2. A Marx generator comprising a plurality of stages between a direct-current source and a load, each of said stages comprising an electrostatic storage device, a thyratron having cathode, grid and anode electrodes, an anode impedance device, and a cathode impedance device, said cathode impedance device of some of said stages being an inductor having a secondary winding to form a transformer;
  each of said electrostatic storage devices having two terminals, one connected to the anode electrode of the same stage and the other coupled to a reference point, said coupling to said reference point being direct in the first stage and including said cathode impedance device for the intermediate stages;
  each of said anode impedance devices connected between the anode electrodes of two adjacent stages;
  each of said cathode impedance devices connected between the cathode electrodes in the intermediate stages, and between the cathode electrode and said reference point in the first stage;
  said load being connected between the cathode of the last stage and a reference point, whereby the output pulse is of the same polarity as said direct current source;
  charging means coupling said direct-current source between the anode electrode of the first stage and a reference point to charge all of said electrostatic storage devices in parallel, the grid electrode of the first stage being coupled to an external trigger source; and
  triggering means coupling the grid and cathode electrodes of each stage other than the first stage to either said external trigger source or to said secondary winding of a previous stage, so that after the first stage is fired into conduction from the external trigger source, the other stages are fired into conduction, which effectively connects all of said electrostatic storage devices in series to supply an output pulse to said load.

3. A Marx generator comprising a plurality of stages between a direct-current source and a load, each of said stages comprising an electrostatic storage device, a thyratron having cathode, grid and anode electrodes, an anode impedance device, and a cathode impedance device, said cathode impedance device of all stages other than the last stage being an inductor having a secondary winding to form a transformer;
  each of said electrostatic storage devices having two terminals, one connected to the anode electrode of the same stage and the other coupled to a reference point, said coupling to said reference point being direct in the first stage and including said cathode impedance device for the intermediate stages;
  each of said anode impedance devices connected between the anode electrodes of two adjacent stages;
  each of said cathode impedance devices connected between the cathode electrodes in the intermediate stages, and between the cathode electrode and said reference point in the first stage;
  said load being connected between the cathode of the last stage and a reference point, whereby the output pulse is of the same polarity as said direct current source;
  charging means coupling said direct-current source between the anode electrode of the first stage and a reference point to charge all of said electrostatic storage devices in parallel, the grid electrode of the first stage being coupled to an external trigger source; and
  triggering means coupling the grid and cathode electrodes for each stage after the first to said secondary winding of a previous stage, so that after the first stage is fired into conduction from the external trigger source, the other stages are fired into conduction in succession by the induced voltages in the secondary windings produced by the discharge current through the cathode impedance devices.

4. A Marx generator comprising a plurality of stages between a direct-current source and a load, said stages being organized into groups of N stages each, each of said stages comprising an electrostatic storage device, a thyratron having cathode, grid and anode electrodes, an anode impedance device, and a cathode impedance device, said cathode impedance devices other than those of the last group being inductors having secondary windings to form transformers;
  each of said electrostatic storage devices having two terminals, one connected to the anode electrode of the same stage and the other coupled to a reference point, said coupling to said reference point being direct in the first stage and including said cathode impedance device of the intermediate stages;
  each of said cathode impedance devices connected between the cathode electrodes in the intermediate stages, and between the cathode electrode and said reference point in the first stage;
  said load being connected between the cathode of the last stage and a reference point, whereby the output pulse is of the same polarity as said direct current source;
  charging means coupling said direct-current source between the anode electrode of the first stage and a reference point to charge all of said electrostatic storage devices in parallel; and
  triggering means coupling the grid electrodes of the stages of the first group to the external trigger source, and coupling each secondary winding to the grid and cathode electrodes of the $N+1$ stage following it, so that after the stages of the first group are fired into conduction from the external trigger source, the other stages are fired into conduction in groups of N stages in succession by the induced voltages in the secondary windings produced by the discharge currents through the cathode impedance devices.

5. A Marx generator according to claim 1, 2, 3 or 4, wherein said anode impedance devices and said cathode impedance devices are all inductors.

* * * * *